(12) United States Patent
Ban et al.

(10) Patent No.: US 7,612,881 B2
(45) Date of Patent: Nov. 3, 2009

(54) METHOD OF ALIGNMENT OF AN OPTICAL MODULE AND AN OPTICAL MODULE USING THEREOF

(75) Inventors: Takuma Ban, Kodaira (JP); Yasunobu Matsuoka, Hachioji (JP); Masato Shishikura, Ome (JP)

(73) Assignee: Hitachi, Ltd., Tokyo (JP)

( * ) Notice: Subject to any disclaimer, the term of this patent is extended or adjusted under 35 U.S.C. 154(b) by 288 days.

(21) Appl. No.: 11/501,047

(22) Filed: Aug. 9, 2006

(65) Prior Publication Data

US 2007/0058904 A1 Mar. 15, 2007

(30) Foreign Application Priority Data

Sep. 14, 2005 (JP) ............................. 2005-266402

(51) Int. Cl.
*G01B 11/00* (2006.01)
(52) U.S. Cl. ....................................... 356/401; 356/614
(58) Field of Classification Search .................. 385/52; 356/401, 614; 33/613, 645; 257/797
See application file for complete search history.

(56) References Cited

U.S. PATENT DOCUMENTS 6,838,689 B1 * 1/2005 Deng et al. ............... 250/559.3
6,960,032 B2 * 11/2005 Eldring et al. ................ 385/93

FOREIGN PATENT DOCUMENTS

JP 2001-088148 4/2001
JP 2001-116962 4/2001

* cited by examiner

*Primary Examiner*—Tarifur Chowdhury
*Assistant Examiner*—Michael Lapage
(74) *Attorney, Agent, or Firm*—Antonelli, Terry, Stout & Kraus, LLP.

(57) ABSTRACT

The present invention provides a method for high precision alignment of a surface emitting laser and a lens in an optical module in which optical coupling between a surface emitting laser and other optical devices such as an optical fiber is realized via lenses, and a structure for providing the method. A lens member 101, in which the lenses 105 are arrayed at a depth t1 from a reference plane 102 and an alignment mark is provided at a depth t2 (t1<t2) is prepared. Then alignment is performed for the lens 105 and the surface emitting laser 106 mounted on the board 110 for a photonic device.

19 Claims, 16 Drawing Sheets

METHOD OF ALIGNMENT OF AN OPTICAL MODULE AND AN OPTICAL MODULE USING THEREOF

CLAIM OF PRIORITY

The present application claims priority from Japanese Application JP 2005-266402 on Sep. 14, 2005, the content of which is hereby incorporated by reference into this application.

FIELD OF THE INVENTION

The present invention relates to a method of aligning a lens and an optical device in manufacture of an optical module for transmitting and receiving an optical signal and an optical module manufactured by applying the method.

BACKGROUND OF THE INVENTION

In association with rapid popularization of the Internet in recent years, a transfer capacity of a backbone optical network provided by a service provider has been becoming increasingly larger. Therefore, there is the strong need for development of a large capacity, low cost, and low power consumption optical module for connected in or between the devices in a facility where a large capacity router, a multiplex transmission device or the like are installed.

There have been proposed various ideas for the optical modules satisfying the need as described above, and there is known the system in which a surface emitting laser represented by the VCSEL (Vertical Cavity Surface Emitting Laser) is used as a light source because of the low cost and the lower power consumption, and also in which photoelectric conversion in the light-receiving side is performed by a surface photodetector represented by the PIN photodiode. Furthermore, a multi-channel optical module having a large capacity is often used in which a plurality of photonic devices is arrayed with a pitch of 250 µm to make use of the low power consumption characteristics of the VCSEL.

In the optical module as described above, a micro lens array is used for realizing tight optical coupling between arrayed photonic devices and an optical fiber array. To prevent generation of stray light between adjoining channels, a diameter of each lens in the micro lens array is at most 250 µm which is identical to a channel pitch between adjoining photonic devices. Therefore, when a spreading angle of outgoing light from a surface emitting laser or an optical fiber is taken into considerations, a distance between a photonic device and a lens and a distance between a lens and an optical fiber are several hundreds µm respectively.

In the optical module in which optical components are provided at positions close to each other as described above, it is necessary to precisely adjust alignment between a micro lens array and photonic devices. For instance, a case is examined below in which a laser with a spreading half angle of outgoing light from a surface emitting laser of about 12 degrees and a multi-mode fiber with a core diameter of 50 µm are optically connected with a convex lens with a lens diameter of 250 µm and a curvature radius of 170 µm. In this case, a direction along the optical axis is defined as axis Z, and directions perpendicular to the optical axis as axis X and axis Y. When a position of a photonic device is displaced by +70 µm in the Z-axial direction and by +10 µm in the X- and Y-axial directions from a relative position of optical components where the maximum coupling efficiency is realized, the coupling efficiency is degraded by 1 dB or more. This fact suggests that highly precise alignment between the photonic device and the lens is required especially in the X- and Y-axial directions.

Recently, in the multi-channel optical module, a data transfer rate per channel of 10 Gbit/s or more is required to satisfy the requirement for a larger capacity. Thus further secure optical coupling is required, and specifically to realize precise alignment between a photonic device and a lens in the X- and Y-axial directions, position adjustment is required with several µm.

Various ideas have been proposed for a method of mounting a photonic device and a lens. One of the methods is disclosed, for instance, in Japanese Patent Laid-Open Publication No. 2001-116962. In the method disclosed in this document, at first a photonic device is mounted on a board for a photonic device, and an end face of the board and a lens array block are engaged with each other by engagement between a concave portion and a convex portion, or between a trench-like concave portion and a column-like protrusion or a column-like member for position adjustment. In this method, however, all of a precision in manufacturing an engagement section for a substrate, a precision in mounting a photonic device onto a board for a photonic device, and a precision in manufacturing an engagement section for a lens carrier contribute to positional displacement between the photonic device and the lens. In this case it is substantially impossible to limit the positional displacement within several µm. Especially it is not practical, from the view point of mass productivity and cost, to manufacture an engagement section for a board for a photonic device with high precision by machining. Therefore, it can be understood that the manufacturing method as described above is not adapted to manufacture of a high speed optical module ensuring strong optical coupling currently required. On the other hand, Japanese Patent Laid-Open Publication No. 2001-88148 discloses a method in which a lens and a photonic device are mounted without machining or the like. In this method, alignment marks are provided on a glass substrate covering a liquid crystal panel and a lens carrier, and position adjustment for the two optical members is performed by visually checking and adjusting the alignment marks.

FIG. 1 is a view schematically showing a case in which position alignment with alignment marks like in the prior art is applied to an optical module. A surface emitting laser 106 and an IC 108 are mounted on a board for a photonic device 110, and also a pedestal 801 is mounted thereon. A lens 105 is provided at a position opposite to the board for a photonic device 110, and also a lens member 101 supported by the pedestal 801, is provided thereon. In this step, position adjustment in the X- and Y-axial directions is performed by visually checking from a top position in the Z-axial direction and adjusting relative positions of an alignment mark 104a provided on a surface of the lens ember 101 and an alignment mark 104b provided on the surface emitting laser 106. A position of the lens member 101 in the Z-axial direction can be decided according to a height of the pedestal 801. Reference numeral 107 denote wiring for connection between the surface emitting laser 106 to the IC 108, and reference numeral 109 denote wiring for connection between the IC 108 and an external circuit. This method provides the advantage that, because the alignment mark 104a provided on the lens member 101 and the alignment mark 104b provided on the surface emitting laser 106 can be manufactured by casting or by a semiconductor process, the mark positions are precise and the mass productivity is excellent. On the other hand, the method has the defects as described below.

Descriptions are provided for a case where the currently most standard 12-channel surface emitting laser 106 and the micro lens array 105 are aligned by means of image recognition with an optical device such as a microscope. In this case, even when the view field of the lens is taken into consideration, a numerical aperture (NA) of the microscope is preferably in the range from about 0.05 to about 0.3. A resolution of the microscope is in inverse proportion to a numerical aperture (NA) of the optical system, and the focal depth in inverse proportion to a square of the numerical aperture (NA). For instance, a microscope having a diameter of a lens view field of 4.5 mm and a numerical aperture of 0.23 has a lens resolution of 1.5 µm and a focal depth of around +5 µm. In this case, even when a distance between an alignment mark 104a on the lens member 101 and an alignment mark 104b on the surface emitting laser 106 are apart from each other by 10 µm, the position adjustment can be performed with a precision of about 1.5 µm at maximum. In a case of a microscope having the numerical aperture of 0.06, the lens resolution is 5.5 µm and the focal depth is about +80 µm. It is generally known that the practical precision of position adjustment is a little lower than the lens resolution. Therefore, when a photonic device and a lens are aligned within the precision of +10 µm by using alignment marks, a light path length between the two marks is preferably at most 200 µm.

However, because it is industrially impossible to manufacture an micro lens array having a small curvature radius (1), and also because there is an electrode pad on a top surface of the surface emitting laser 106 and wire is bonded to the pad so that the lens member 101 cannot directly be accessed (2), the lens member 101 and the surface emitting laser 106 are apart from each other by about 200 µm to about 500 µm in terms of a light path length. With the structure based on the prior art, also a distance between the two marks is larger, so that it is impossible to align the photonic device and the lens with high positional precision.

Patent document 1: Japanese Patent Laid-Open Publication No. 2001-116962

Patent document 2: Japanese Patent Laid-Open Publication No. 2001-88148

SUMMARY OF THE INVENTION

The present invention has been made to solve the problems as described above, and an object of the present invention is to provide a method of alignment ensuring precise position adjustment between a surface emitting laser and a lens member during manufacture of an optical module, and an optical module manufactured by applying the method.

In the present invention, the problems in the prior art are solved by providing a step on a surface of a lens member provided at a position opposite to a surface emitting laser. More specifically, a step protruding toward a board for a photonic device is provided on a surface of the lens member at a position not affected by an electrode pad on the surface emitting laser nor by wire bonded to the electrode pad, and an alignment mark is provided on a surface of the step.

In an optical module in which a lens is used for optical coupling between a surface emitting laser and an optical fiber or an optical waveguide, even when a lens in the lens member and a surface emitting laser are away from each other, the lens and the surface emitting laser can precisely be coupled to each other optically.

BRIEF DESCRIPTION OF THE DRAWINGS

FIG. 18 is a general block diagram illustrating an example in which an optical module with an optical fiber coupled thereto is mounted on a board for a router, a transfer device and the like.

DETAILED DESCRIPTION OF THE PREFERRED EMBODIMENTS

Embodiments of the present invention will be described below with reference to the related drawings. The axis Z of the coordinate shown in the figures indicates an optical axis of a photonic device.

First Embodiment

Figure 1:
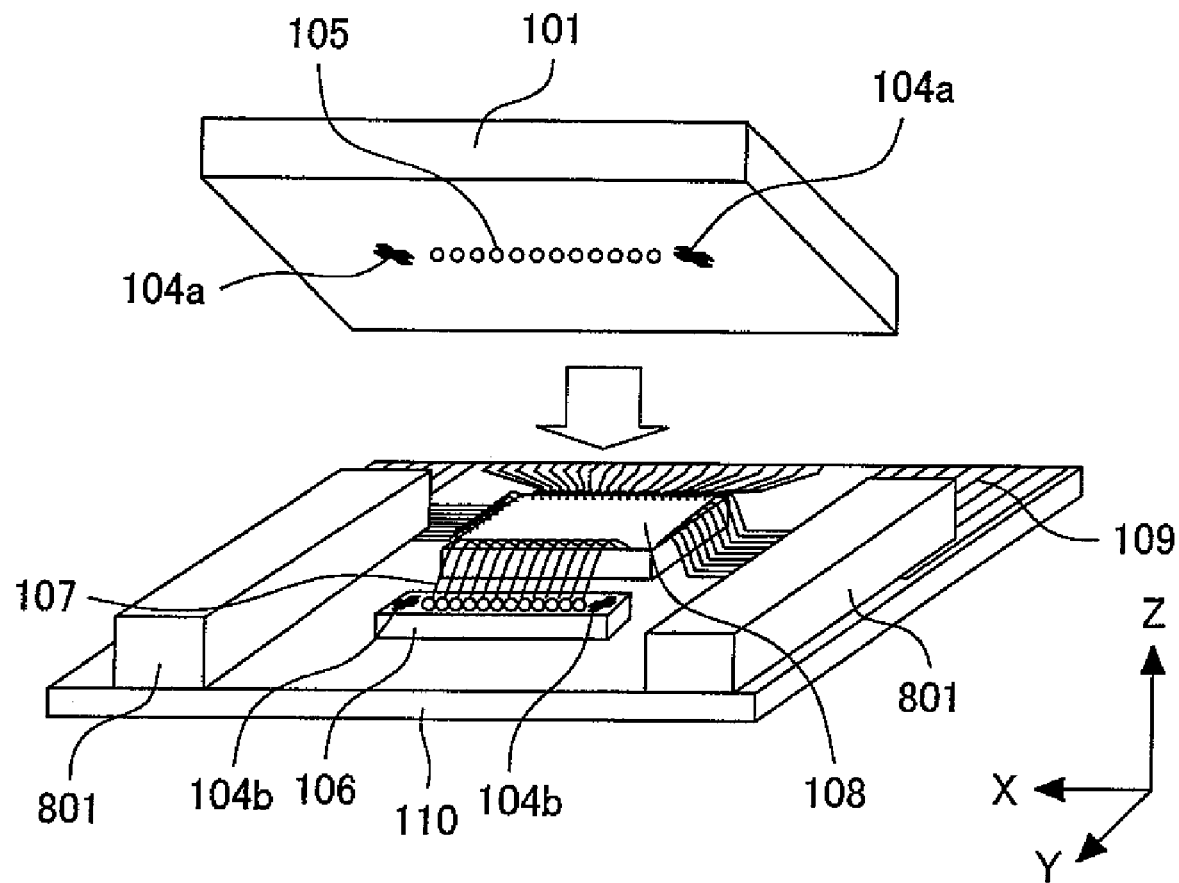
FIG. 1 is a view illustrating a situation in which position adjustment with alignment marks like that employed in the prior art is applied to an optical module.
Figure 2:
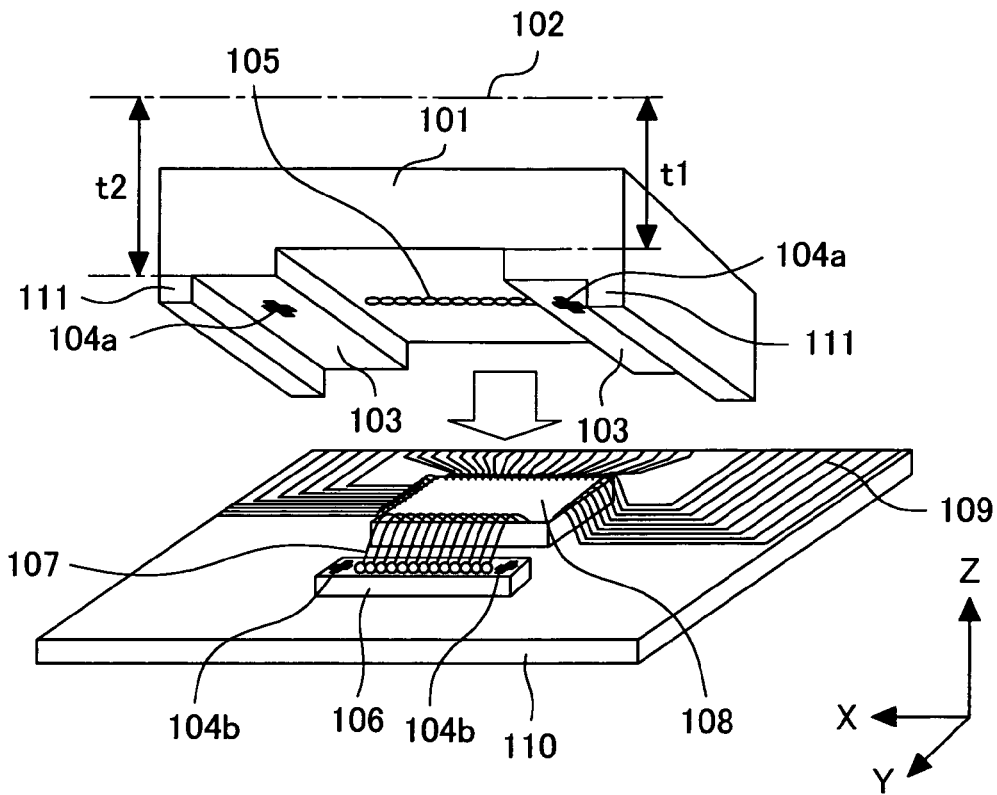
FIG. 2 is a view illustrating outline of a case in which position adjustment with alignment marks according to a first embodiment of the present invention is applied to an optical module.
Figure 3:
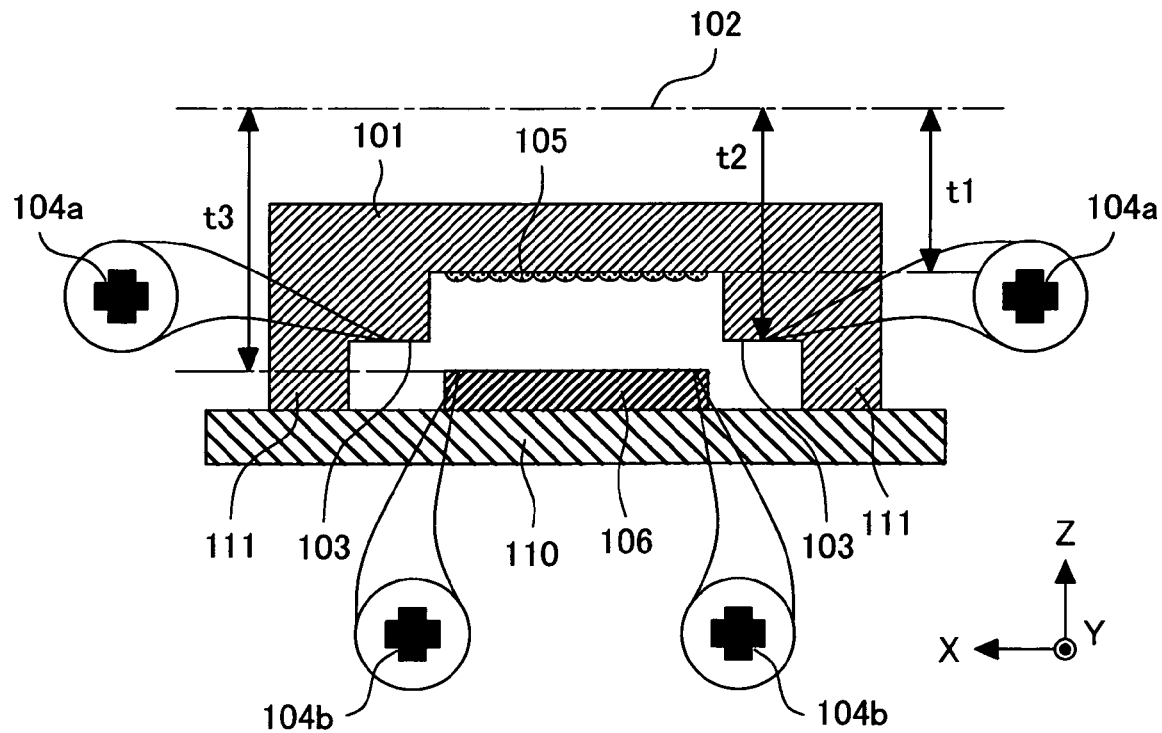
FIG. 3 is a general cross-sectional view of the optical module, in which position adjustment with the alignment marks according to the first embodiment is applied, taken at a position of the lens array.

FIG. 2 is a view illustrating a case where position adjustment with alignment marks according to a first embodiment of the present invention is applied to an optical module. FIG. 3 is a cross-sectional view illustrating an optical module in which position adjustment with the alignment marks according to the first embodiment is applied, and the cross-section is taken at a position of a lens array 105. An IC 108 and a surface emitting laser 106 are mounted on a board 110 for a photonic device. An alignment mark 104b is provided on a top surface of the surface emitting laser 106. Wiring 107 is provided between the IC 108 and the surface emitting laser 106, and electric wiring 109 for connection to an external circuit is provided on the IC 108. A lens member 101 with the lens array 105 formed thereon is arranged at a position opposite to the surface emitting laser 106. In the first embodiment, a supporting member 111 is formed as a spacer at each of the two end portions in place of a pedestal 801 shown in FIG. 1, and a protruding portion having an end face 103 is provided between the supporting member 111 and the lens array 105. An alignment mark 104a is provided on the end face 103 of the protruding portion.

In the following description, assuming an appropriate position on a rear surface of the side on which the lens array 105 formed on the lens member 101 is provided as a reference plane 102, t1 is a distance between the reference plane 102 and the surface on which the lens array 105 is placed, while t2 is a distance between the reference plane 102 and the end face 103. In this case, the end face 103 is provided on the protruding portion protruding from the surface on which the lens array 105 is provided, and therefore the distance t1 is smaller than the distance t2 (t1<t2). Because of the configuration as described above, it is clear that the distance between the end face 103 and the surface emitting laser 106 is smaller than that between a surface with the lens array 105 provided thereof and the surface emitting laser 106. Namely, even when a distance between the surface with the lens array 105 provided thereon and the surface emitting laser 106 is made larger according to the necessity, the alignment mark 104b provided on the end face 103 is sufficiently close to the alignment mark 104b provided on the surface emitting laser 106. Therefore, when observing with a microscope or the like from a top position in the Z-axial direction, the alignment marks 104a and 104b can visually and clearly be recognized, which enables highly precise position adjustment.

Figure 4:
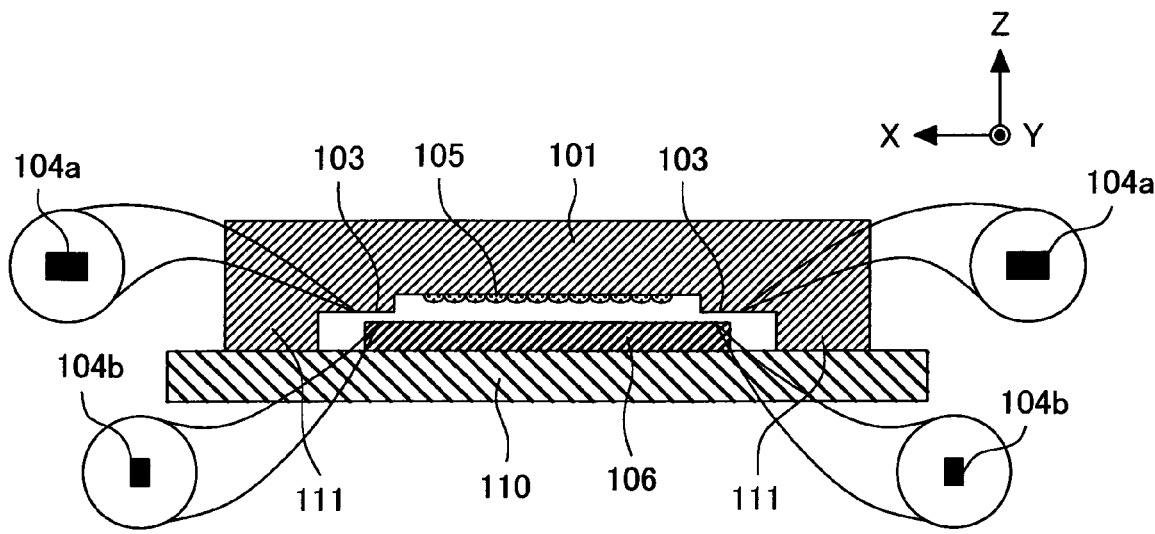
FIG. 4 is a cross-sectional view illustrating the same configuration as that shown in FIG. 3, in which an end of an end face of a protruding portion of a lens member overlaps an end of a surface emitting laser.

FIG. 4 is a cross-sectional view illustrating the same configuration as that shown in FIG. 3, in which an end of the end face 103 of the protruding portion overlaps an end of the surface emitting laser 106. The alignment marks 104a and 104b have forms different from those shown in FIG. 3.

Figure 5:
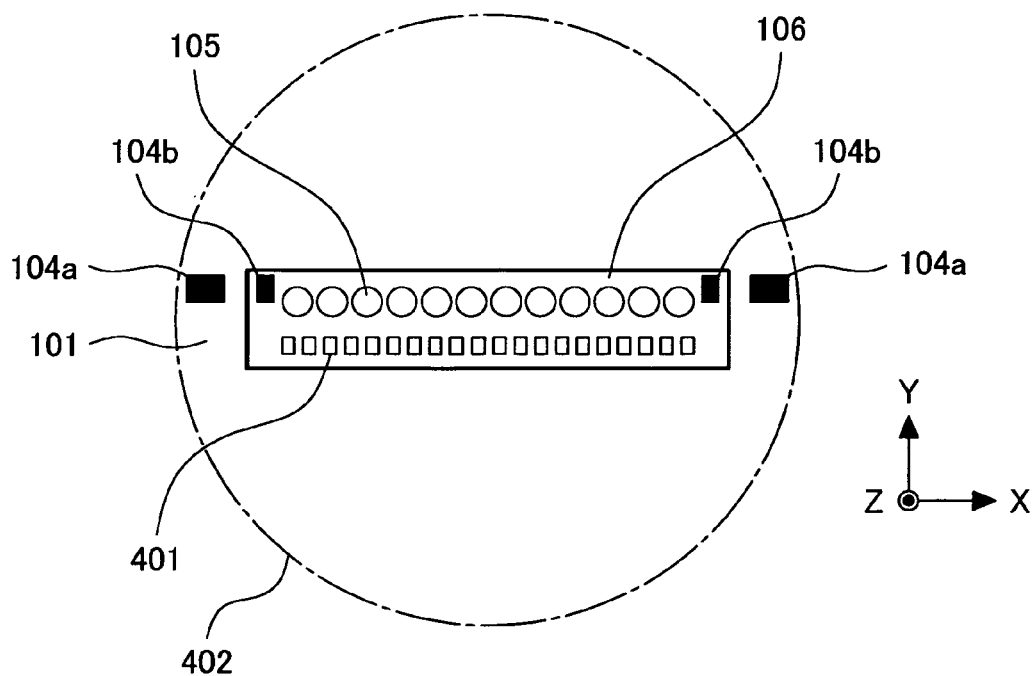
FIG. 5 is a view schematically showing an example of an image taken during a process of aligning a lens array and a surface emitting laser by visually checking from a top position in the Z-axial direction after alignment performed by observing with a microscope is completed.

FIG. 5 is a view schematically showing an example of an image acquired with a microscope during a process for aligning the lens array 105 and the surface emitting laser 106 by checking from a top position in the Z-axial direction, and shows the state in which alignment is substantially completed. Reference numeral 402 denotes a line indicating a field of view which can be observed with the microscope. There are alignment marks 104a provided at end faces 103 of the protruding portions at the central portions in the view field 402. The surface emitting laser 106 is placed between the alignment marks 104b, and the alignment mark 104b provided on the surface emitting laser 106 opposes the alignment marks 104a. Reference numeral 401 denotes a connection pad (patterned electrode) for the surface emitting laser 106. It can be determined that alignment is completed when it is recognized that the alignment marks 104b and the alignment marks 104a are not displaced from each other in the vertical direction nor in the horizontal direction. When alignment is completed, a luminous surface itself or an acceptance surface itself of the surface emitting laser 106 overlaps the lens array 105 and can hardly be checked visually. This is the reason why the surface emitting laser 106 is provided with the alignment marks 104b. Preferably a light path length extending from the reference plane 102 to the alignment marks 104a on the end face 103 of the protruding portion of the lens member 101 is substantially identical to a light path length extending from the reference plane 102 to the alignment mark 104b provided on a top surface of the surface emitting laser 106. At least, when a difference between the two light paths is within 200 μm at maximum, as shown in FIG. 5, the alignment marks 104a and 104b are well recognized on an image acquired with a microscope.

Figure 6:
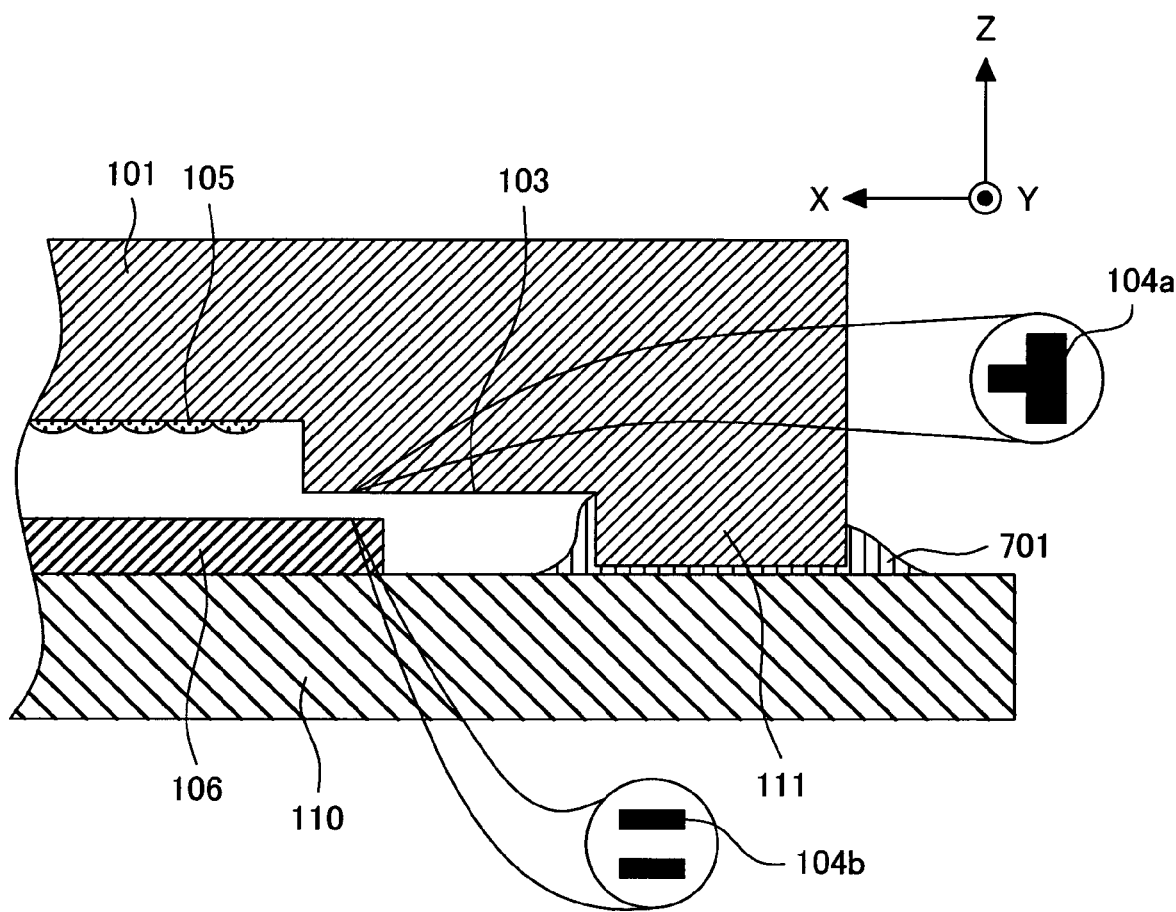
FIG. 6 is a cross-sectional view illustrating the same configuration as that shown in FIG. 4, in which an end of an end face of a protruding portion of a lens member overlaps an end of a surface emitting laser, and positions of the alignment marks provided on the two components are substantially identical in the X- and Y-axial directions.

FIG. 6 is a cross-section view illustrating the same configuration as that shown in FIG. 4, in which an end of the end face 103 of the protruding portion overlaps an end of the surface emitting laser 106, and in which positions of the alignment mark 104a and the alignment mark 104b are substantially identical in the X-axial and Y-axial directions. In FIG. 6, the alignment mark 104a and the alignment mark 104b are shown, different from FIG. 4, in the state where the alignment mark 104a and the alignment mark 104b overlap each other and the positional correspondence between the two alignment marks can easily be recognized. FIG. 6 also shows the situation in which the supporting section 111 is secured to a surface of the board 110 for a photonic device with adhesive 701. The adhesive 701 is secured to the surface of the board 110 for a photonic device, after alignment, with ultraviolet ray, thermally, or naturally.

Figure 7:
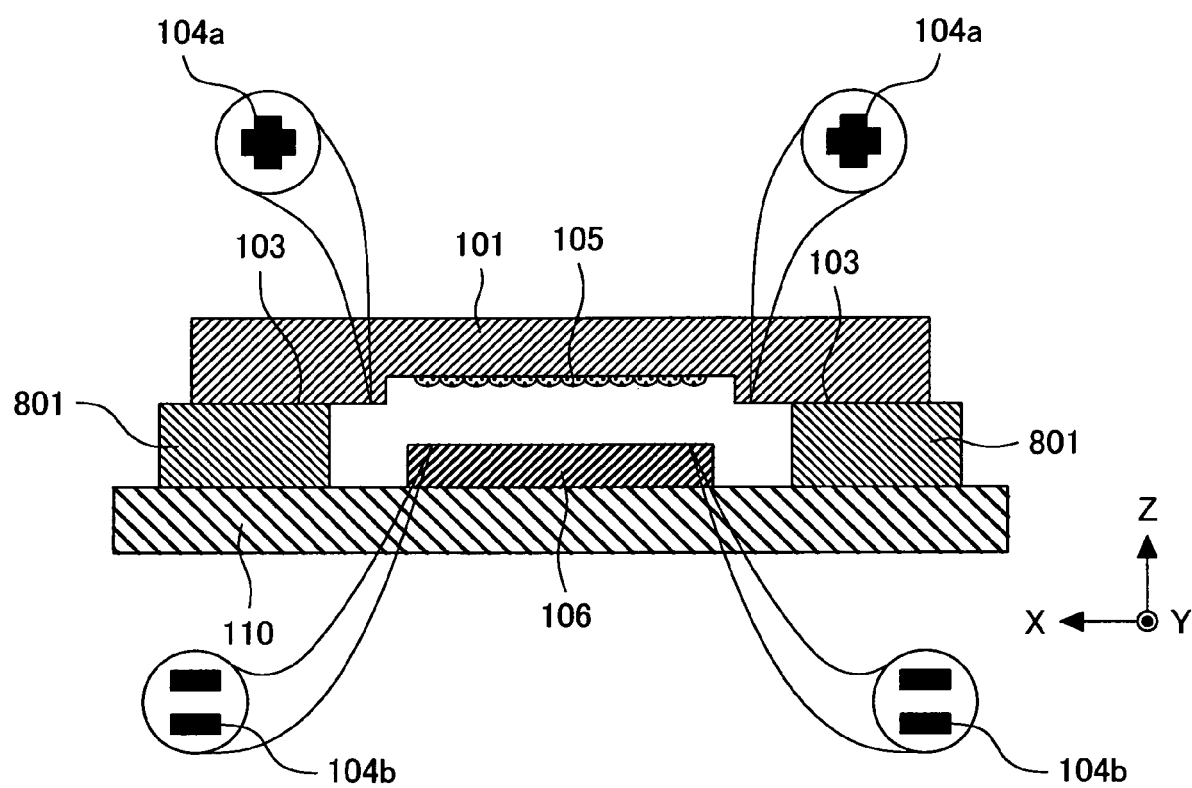
FIG. 7 is a cross-sectional view illustrating the same configuration as that shown in FIG. 3, in which there is no supporting section for the lens member and an outer side portion of an end of an end face of a protruding portion of the lens member is supported by a base.

FIG. 7 is a cross-sectional view illustrating the same configuration as that shown in FIG. 3, in which there is no supporting member 111 for the lens member 101 and an outer side portion of an end of an end face 103 of a protruding portion of the lens member is supported by a pedestal 801. Also in this case, as shown in FIG. 3, the end face 103 of the protruding portion and a surface of the surface emitting laser 106 are close to each other, so that position adjustment can be performed with high precision. Furthermore, since a distance between the lens and the photonic device in the Z-axial direction is fixed, alignment in the X-axial and Y-axial directions can easily be performed. In FIG. 7, the alignment marks 104a and 104b have different forms from those shown in FIG. 3. A portion of the lens member is mounted on a board for a photonic device with a photonic device mounted thereon, or on a portion of a pedestal mounted on the board for a photonic device, and alignment of the surface emitting laser and the lens is performed in the state. In the current manufacturing technique, when an error of warpage of the board 110 for a photonic device is ±several µm and an error of machining precision for the pedestal 801 is ±several tens µm, machining can be performed with the relatively low cost, and therefore alignment in the Z-axial direction is not required.

Figure 8:
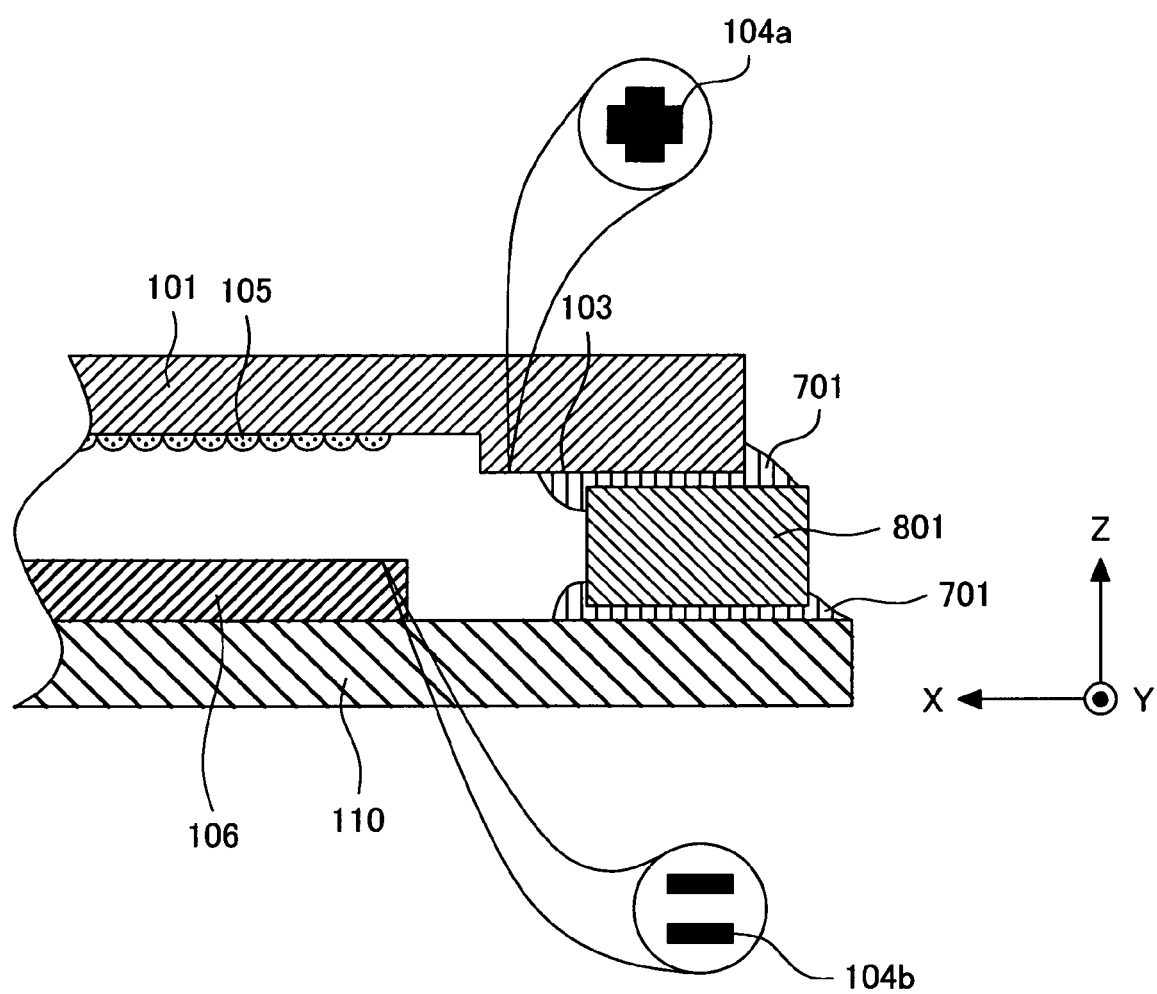
FIG. 8 is a cross-sectional view illustrating the same configuration as that shown in FIG. 7, in which an end face of the protruding portion and the board for a photonic device are connected with adhesive via both faces of the base.

FIG. 8 is a cross-sectional view illustrating the same configuration as that shown in FIG. 7, in which the lens member 101 are secured to the board 110 for a photonic device with adhesive 701 via both faces of the pedestal 801 between the end face 103 of the protruding portion and the board 110 for a photonic device. The adhesive 701 is hardened with ultraviolet ray, thermally, or naturally after alignment.

Figure 9:
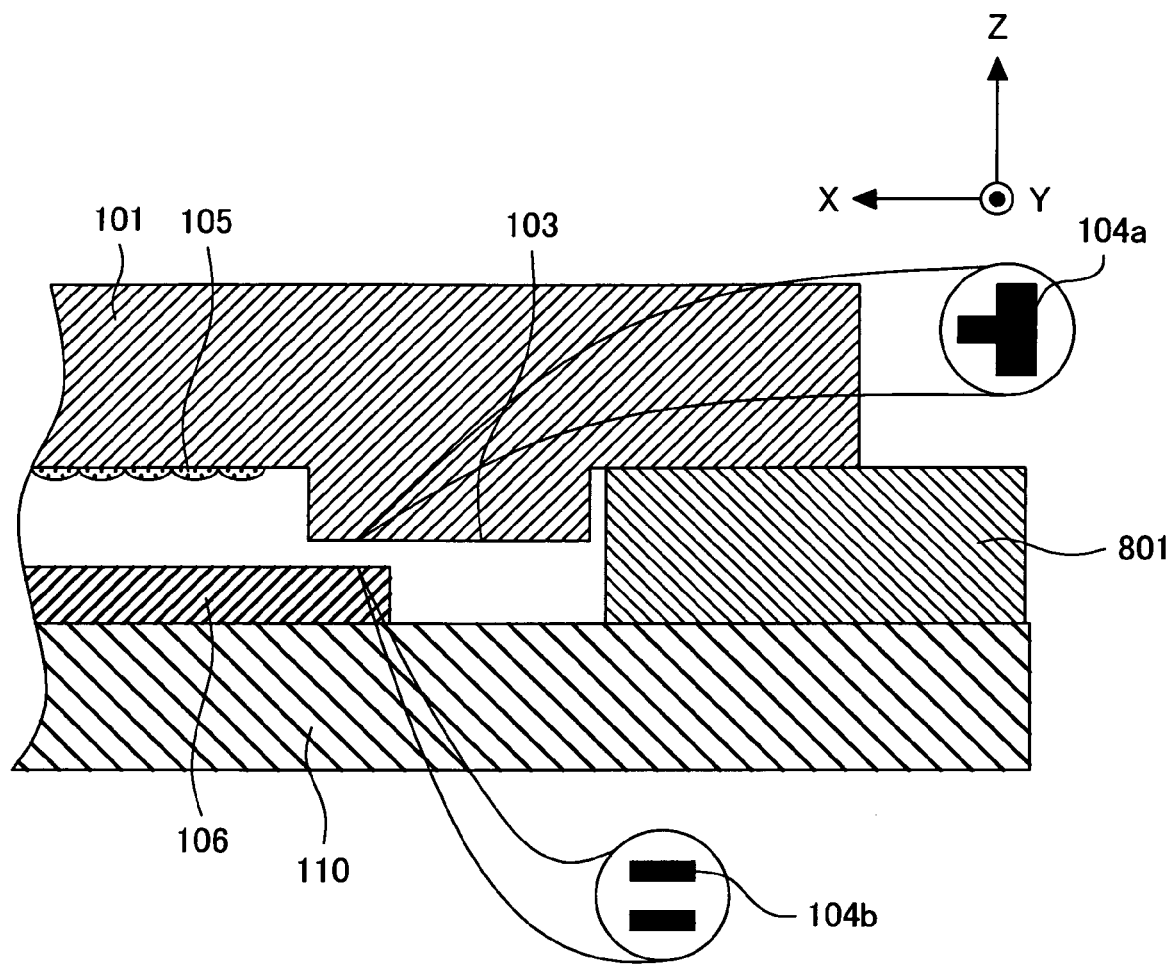
FIG. 9 is a cross-sectional view illustrating the same configuration as that shown in FIG. 6, in which an end of an end face of a protruding portion of a lens member overlaps an end of a surface emitting laser, but there is no supporting section for the lens member, and an outer side of the end of the end face of the protruding portion of the lens member is notched and is supported by a base.

FIG. 9 is a cross-sectional view illustrating the same configuration as that shown in FIG. 6, in which an end of the end face 103 of the protruding portion overlaps an end of the surface emitting laser 106, but there is no supporting member 111 for the lens member 101, and an outer side of the end of the end face of the protruding portion of the lens member is notched and is supported by the pedestal 801. In this example, when the pedestal 801 is bonded to the end face 103 of the protruding portion with adhesive, overflowing adhesive is prevented from flowing toward the lens array 105, and also the lens member 101 can be positioned in the X-axial and Y-axial directions in the state where the pedestal 801 is pressed to a notched face of the end face 103 of the protruding portion, so that the operation can be performed quite easily. The adhesive is hardened with ultraviolet ray, thermally, or naturally after alignment.

Second Embodiment

In the first embodiment, the alignment mark 104a is provided on the end face 103 of the protruding portion of the lens member 101 and also the alignment mark 104b is provided on the surface emitting laser 106. A second embodiment of the present invention uses the alignment mark 104b for the surface emitting laser 106.

Figure 10A:
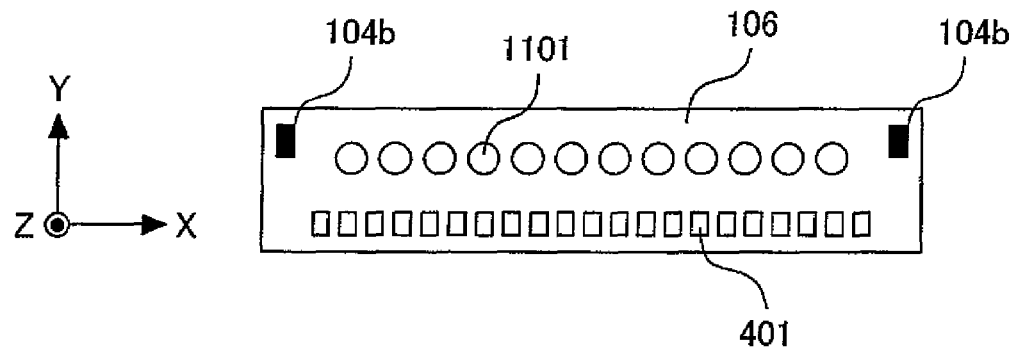
FIG. 10A to FIG. 10C are plan views each illustrating a top surface of a surface emitting laser.
Figure 10B:
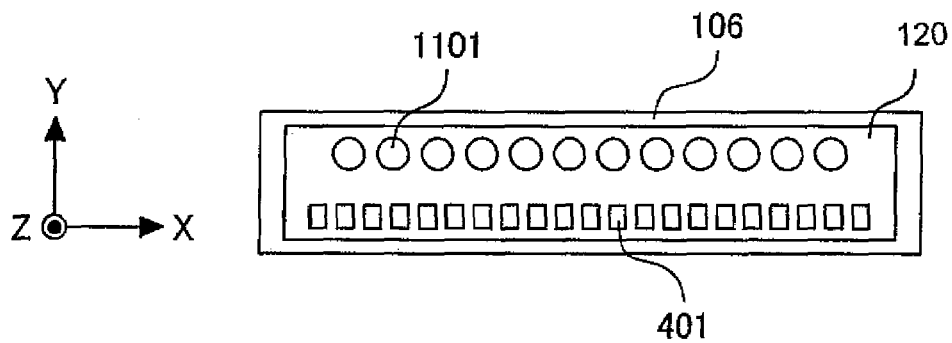
Figure 10C:
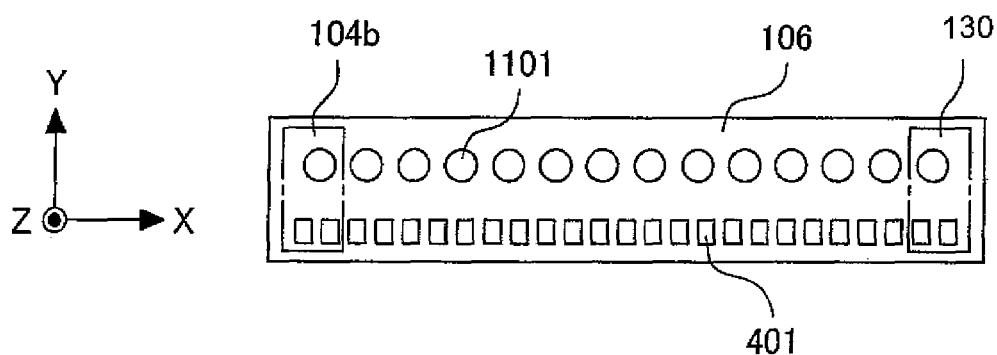

FIG. 10A to FIG. 10C are plan views each illustrating a top surface of the surface emitting laser 106. FIG. 10A is a view corresponding to FIG. 5, and in FIG. 10A, light-emitting devices or light-receiving devices 1101 are shown in place of the lens array 105. FIG. 10A illustrates an example of the surface emitting laser 106 according to the first embodiment, and the alignment mark 104b is provided thereon.

FIG. 10B illustrates a case different from that shown in FIG. 10A, in which a line 120 surrounding the light-receiving devices 1101 and electrodes 401 is used in place of the alignment mark 104b described above. FIG. 10C illustrates an example in which additional one set 130 of the light-receiving device 1101 and the electrode 401 associated with the light-receiving device 1101 is formed in both sides and is used in place of the alignment mark 104b. In the case shown in FIG. 10C, any specific pattern to be used as the alignment mark 104b is not prepared, and an array of the light-receiving devices 1101 formed on a silicon wafer shall be cutout not as the 12-channel arrayed surface emitting laser 106 which is currently most popular, but as the 14-channel surface emitting laser 106.

The second embodiment of the present invention provides the merit that the alignment mark 104b can be formed during a semiconductor process of manufacturing the surface emitting laser 106.

Third Embodiment

Figure 11:
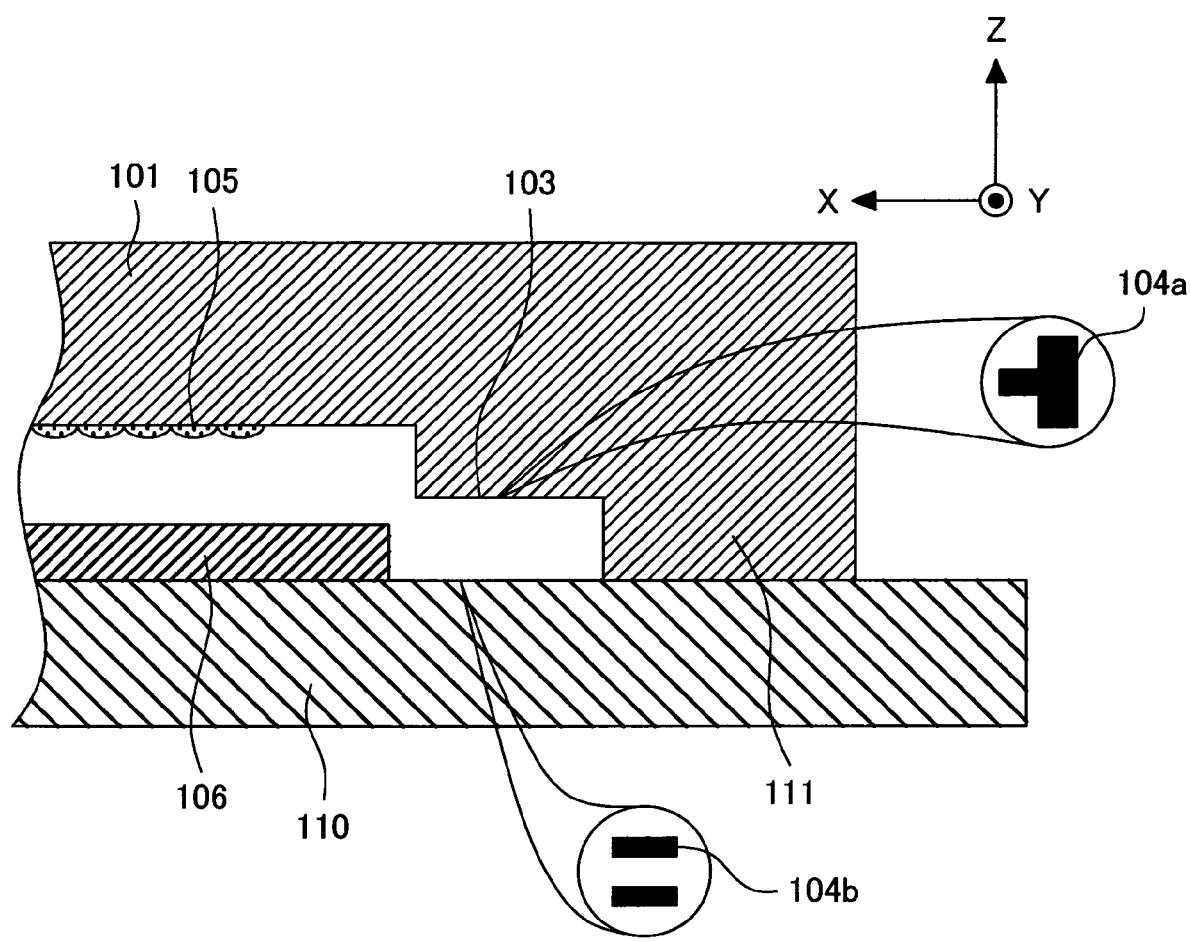
FIG. 11 is a cross-sectional view illustrating the configuration similar to that shown in FIG. 3, in which alignment marks are provided on a surface of a board for a photonic device and on a protruding portion of a lens member respectively.

FIG. 11 is a cross-sectional view illustrating the configuration similar to that shown in FIG. 3, in which alignment marks 104b and 104a are provided on a surface of the board 110 for a photonic device and at an end of the end face 103 of a protruding portion of the lens member respectively. The alignment mark 104b is used to precisely mount the surface emitting laser 106 on the board 110 for a photonic device, and also functions as a reference for positioning the lens member 101. As a result, relative positions of the surface emitting laser 106 and the lens member 101 can be decided correctly.

Fourth Embodiment

Alignment may be performed by visually checking the surface emitting laser 106 and the alignment mark 104a provided on the lens member 101 from above to overlay the surface emitting laser 106 and the alignment mark 104a on each other, but even when the alignment marks 104a and 104b are away from each other in the X-axial direction or in the Y-axial direction, alignment can be performed. First and second examples of alignment between the surface emitting laser 106 the lens member 101 will be described below with reference to FIG. 12 and FIG. 13.

Figure 12A:
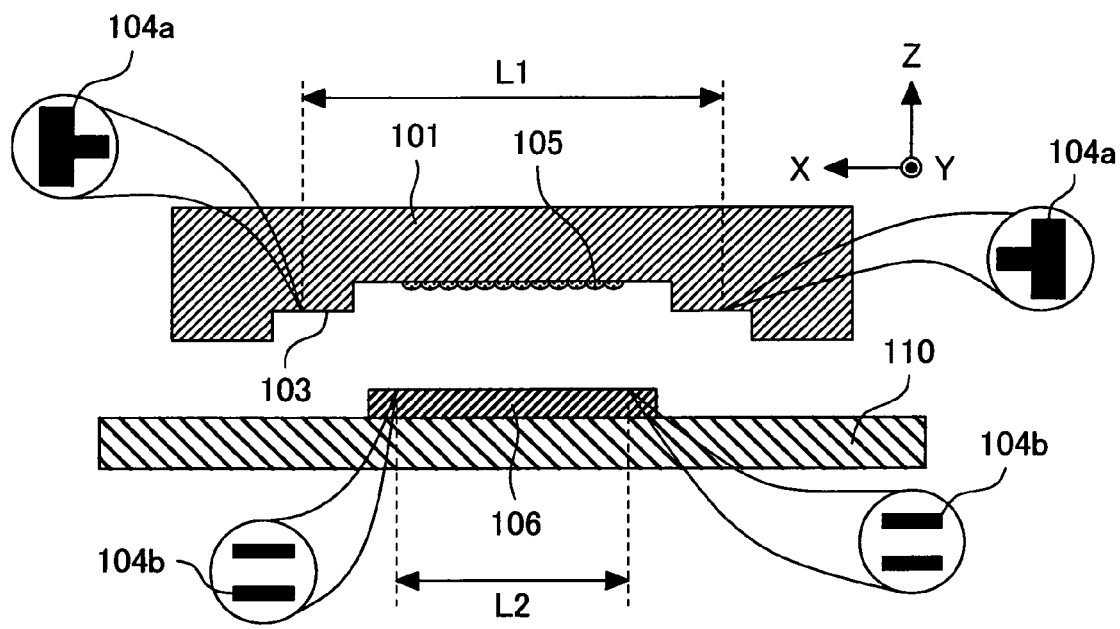
FIG. 12A to FIG. 12C are views each illustrating a first example of alignment processing for a surface emitting laser and a lens member.
Figure 12B:
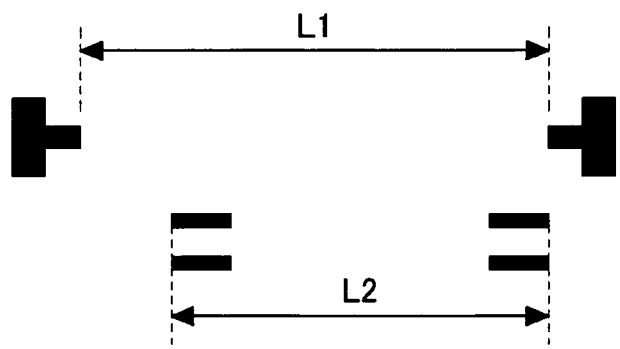
Figure 12C:

FIG. 12A is a view illustrating the configurations of the surface emitting laser 106 and the lens member 101 shown in FIG. 3. In the following description, L1 is a distance between the alignment marks 104a provided in both sides of the lens array 105 of the lens member 101, and L2 is a distance between the alignment marks 104b at both ends of the surface emitting laser 106. FIG. 12B is a view illustrating an example of a relation between the alignment mark 104a and the alignment mark 104b in the state where alignment has not been performed and the surface emitting laser 106 and the lens member 101 are roughly positioned at the required positions. FIG. 12C is a view illustrating an example of a relation between the alignment mark 104a and the alignment mark 104b in the state where alignment has been performed by controlling relative positions of the two alignment marks. In this step, the image recognition line shown with a dotted line is drawn on a monitor, relative positions are calculated and aligned so that a distance in the X-axial direction between the alignment mark 104a and the alignment mark 104b is set to (L1−L2)/2, and also relative positions in the Y-axial direction are controlled so that a protruding portion of the alignment mark 104a comes in between two mark lines on the alignment mark 104b.

Figure 13A:
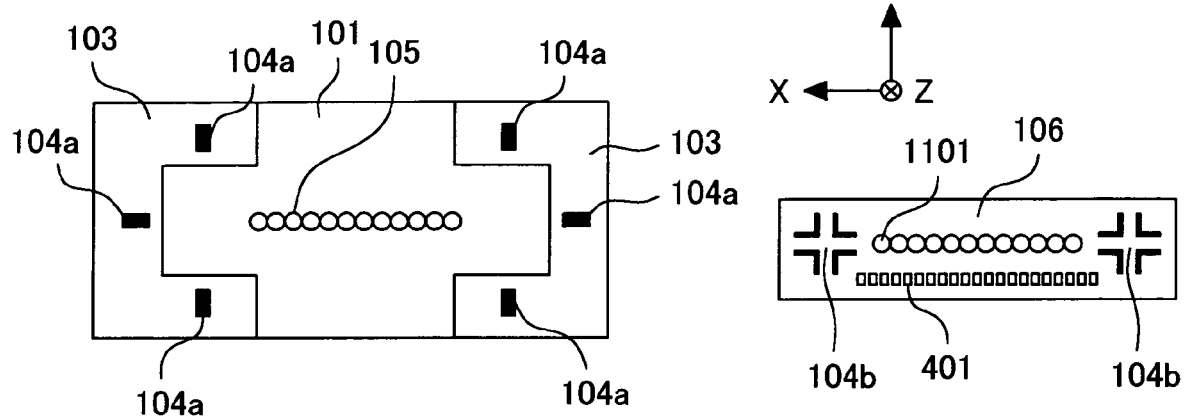
FIG. 13A to FIG. 13C are views each illustrating a second example of alignment processing for a surface emitting laser and a lens member.
Figure 13B:
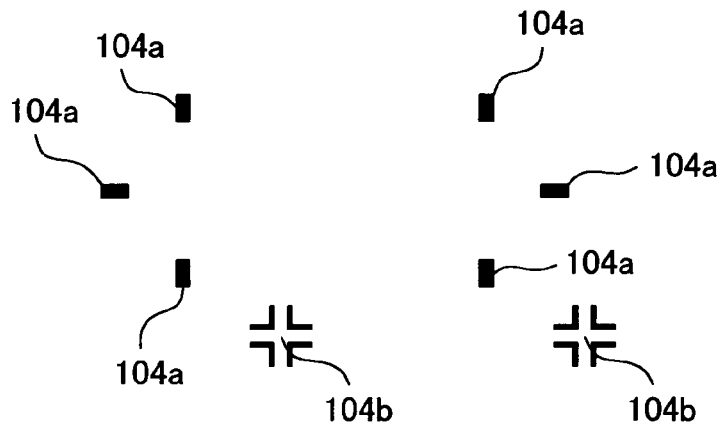
Figure 13C:
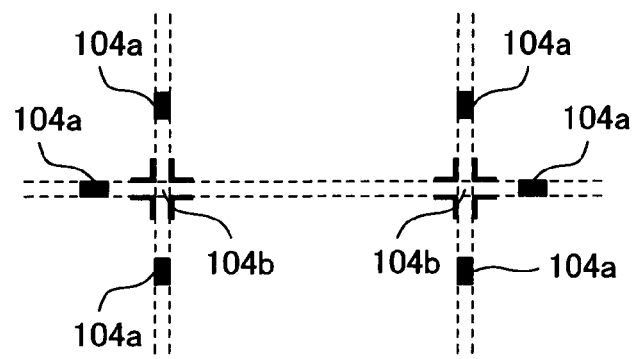

FIG. 13A is a plan view illustrating a configuration, in which the end face 103 pf a protruding portion of the lens member 101 and a bottom face of the lens member 101 in association with the alignment mark 104a formed thereon are shown in the left side, and the surface emitting laser 106 corresponding to that shown in FIG. 10A is shown in the right side. In the case shown in FIG. 13A, alignment is performed in the state where the alignment marks 104b at both ends of the surface emitting laser 106 are surrounded by three alignment marks 104a on the end face 103 of protruding portions of the lens array 105 of the lens member 101. FIG. 13B is a view illustrating an example of a relation between the alignment mark 104a and the alignment mark 104b before alignment in the state where the surface emitting laser 106 and the lens member 101 are roughly positioned at the required positions. FIG. 13C is a view illustrating a relation between the alignment mark 104a and the alignment mark 104b after alignment is performed by controlling relative positions of the two alignment marks. In this step, at first the image recognition line shown by the dotted line is drawn on a monitor, and then relative positions of the alignment mark 104a and the alignment mark 104b are aligned so that in the X-axial direction the centers of the two alignment marks 104a coincide with the center of the alignment mark 104b. For alignment in the Y-axial direction, relative positions of the alignment mark 104a and the alignment mark 104b are aligned so that the centers of the alignment marks 104a in both sides coincide with those of the alignment marks 104b.

Fifth Embodiment

Figure 14A:
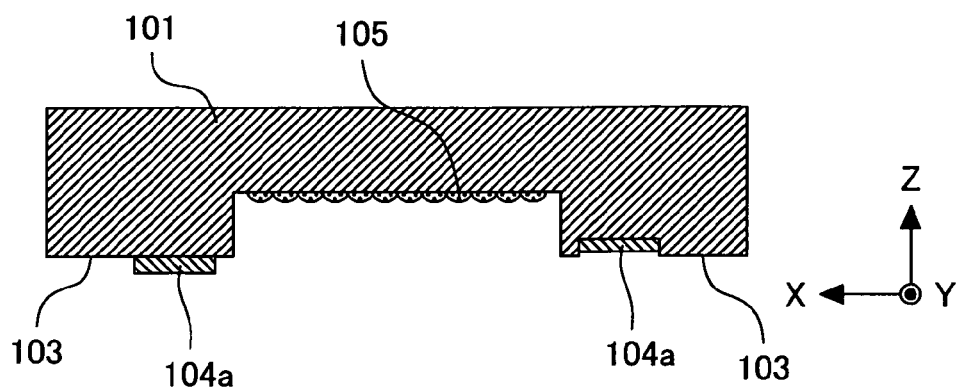
FIG. 14A and FIG. 14B are views each illustrating an alignment mark according to a fifth embodiment of the present invention.
Figure 14B:
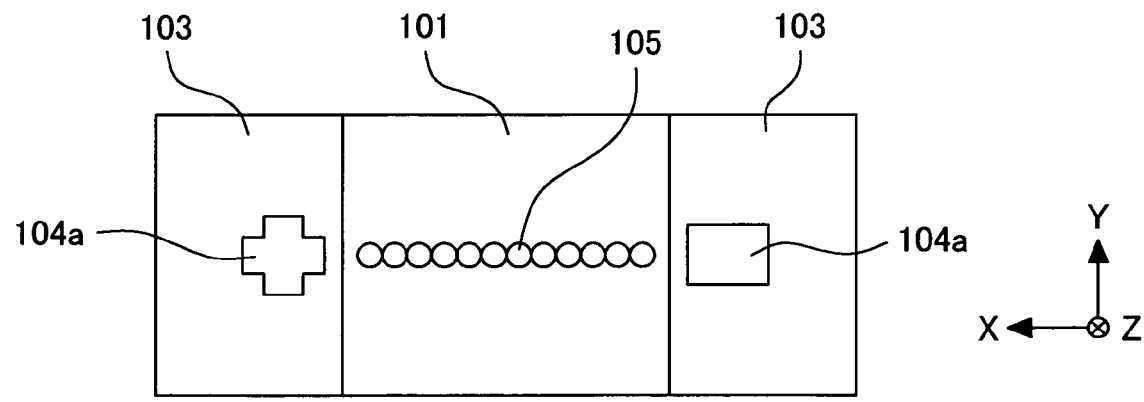

The alignment marks 104a, 104b according to a fifth embodiment of the present invention will be described below with reference to FIG. 14. In the preceding embodiments, for enhancement of visual recognition the alignment marks 104a, 104b are drawn on the end face 103 of a protruding portion of the lens member 101 and on a surface of the surface emitting laser 106. Each of the alignment marks described above is made from a thin film made of a material such as a metal or a dielectric material with at least any of the optical refractive index, the optical absorbance, and the optical reflectance different from those of a material for an area around the alignment marks, and such a thin film is made to adhere to surfaces. In this embodiment, the alignment mark is provided in a convex form or in a concave form on a respective surface. FIG. 14A is a cross-sectional view illustrating an example of the alignment mark 104a provided in both sides of the lens array 105 of the lens member 101. FIG. 14B is a bottom view illustrating the configuration shown in FIG. 14A. When a material for the lens member 101 is glass, plastics, or the like, it is possible to simultaneously form the lens array 105 and the alignment mark 104, for instance, by casting, which ensures the excellent mass productivity.

Sixth Embodiment

Figure 15A:
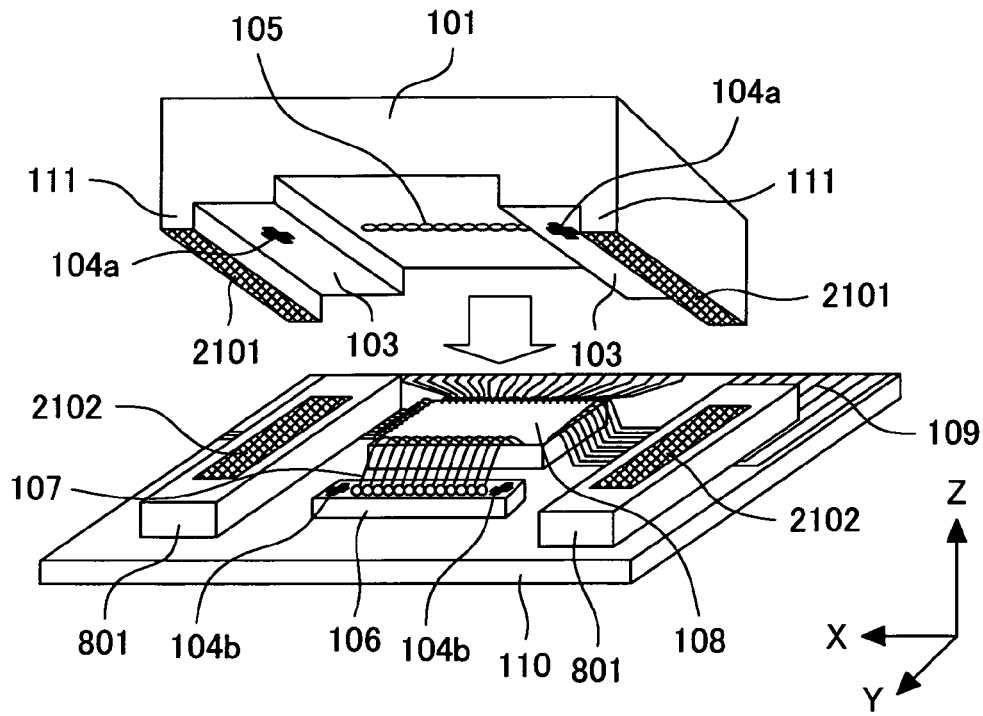
FIG. 15A and FIG. 15B are views each illustrating a case in which position adjustment with an alignment mark according to a sixth embodiment of the present invention is applied to an optical module.
Figure 15B:
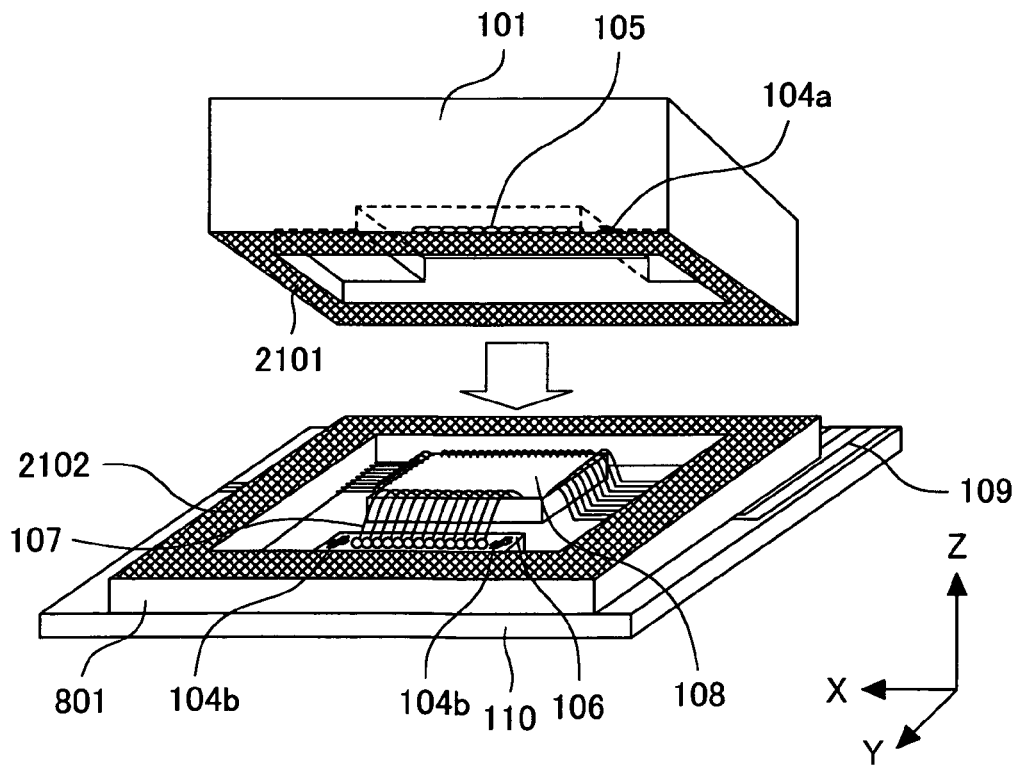

FIG. 15A is a view illustrating a structure in which the lens member 101 is supported by placing a supporting member 111 on the pedestal 801 adhered onto a surface of the board 110 for a photonic device. In the drawing, a metal thin film pattern 2102 is formed on the pedestal 801, a solder pattern 2101 is formed on the supporting member 111, and the solder pattern 2101 is fused for fixing after alignment for the lens array 105 and the surface emitting laser 106 is completed. FIG. 15B is a view illustrating another configuration. Referring to the same drawings, the pedestal 801 completely surrounds the surface emitting laser 106 and the IC 108 and also the supporting member 111 completely surrounds a circumferential portion of the lens member 101. The solder pattern 2101 is fused for fixing after alignment for the lens array 105 and the surface emitting laser 106 is completed. In this state, the surface emitting laser 106 and the IC 108 are shielded from the outside, so that the optical module can operate in the stable conditions without being affected by dust in the peripheral air.

Other Embodiments

Figure 16:
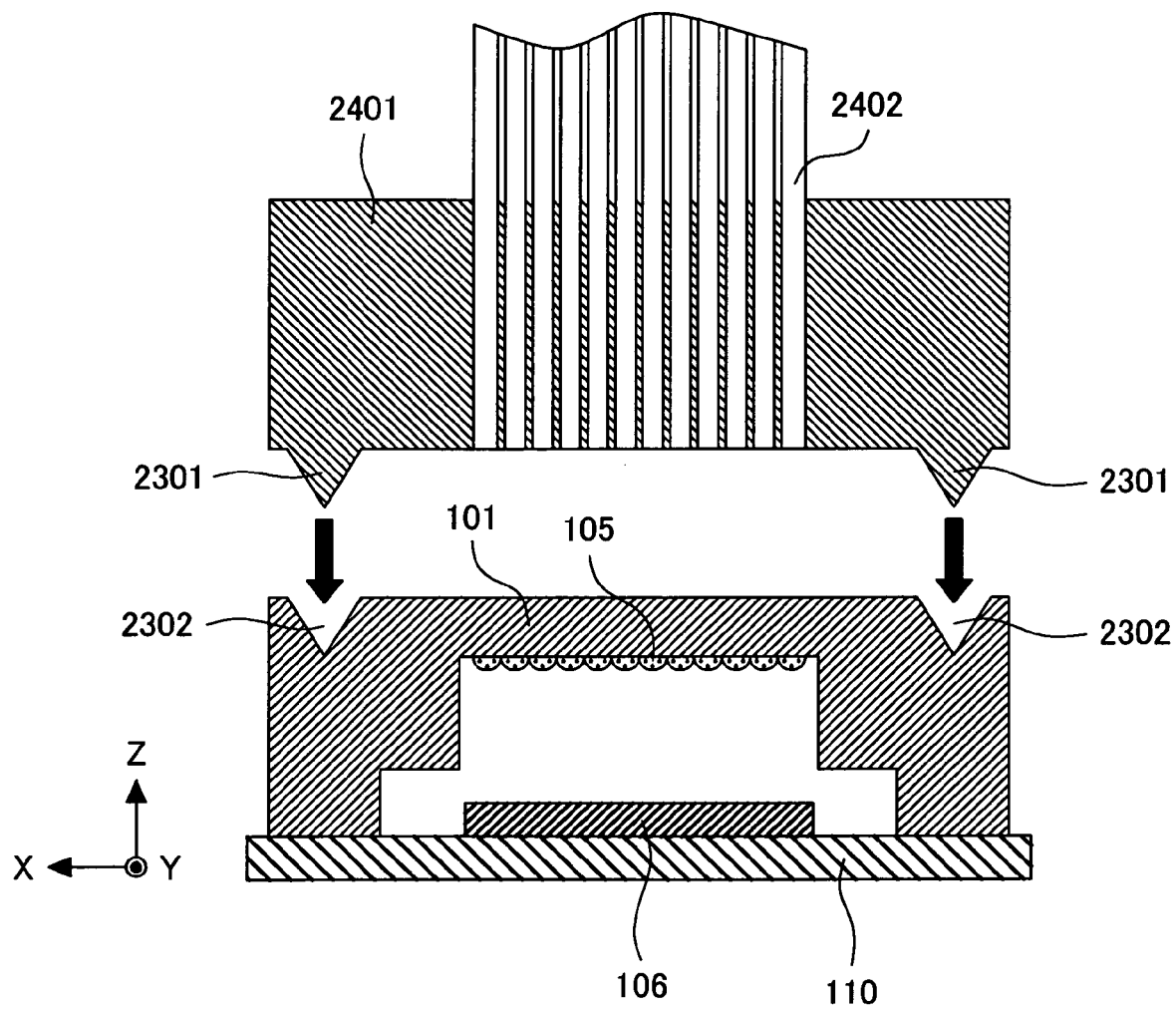
FIG. 16 is a cross-sectional view illustrating an example of a structure in which a lens array and a surface emitting laser are aligned and an optical fiber holder is coupled to an integrated optical module.

Applications of the optical module according to the present invention will be described with reference to FIGS. 16 to 18. FIG. 16 is a cross-sectional view illustrating a configuration of one application of the optical module. In the drawing, an optical fiber holder 2401 is coupled to a surface opposite to a surface in the side on which the lens array 105 of the lens member 101 of an optical module with the lens member 101 and the board 110 for a photonic device integrated therein is provided after the lens array 105 and the surface emitting laser 106 are aligned to each other. A convex portion 2301 for fitting is provided on the optical fiber holder 2401, and a fitting concave portion 2302 is provided on a surface facing a surface in the side on which the lens array 105 of the lens member 101 is provided. Since the fitting convex portion 2301 and the fitting concave portion 2302 are formed in a face-to-face relationship, the two portions can tightly be fitted to and engaged with each other by pressing the optical fiber holder 2401 to the lens member 101 as indicated by an arrow in FIG. 16. In the state where the optical fiber holder 2401 and the lens member 101 are fitted to and engaged with each other, optical fibers 2402 are fixed at positions associated with the lenses in the lens array 105. In the description above, it is assumed that the optical fiber holder 2401 holds the optical fiber 2402, but also the configuration is allowable in which components for forming an optical circuit such as a polarizing plate, a wavelength plate, an attenuator are inserted and then the optical fiber is fixed.

Figure 17:
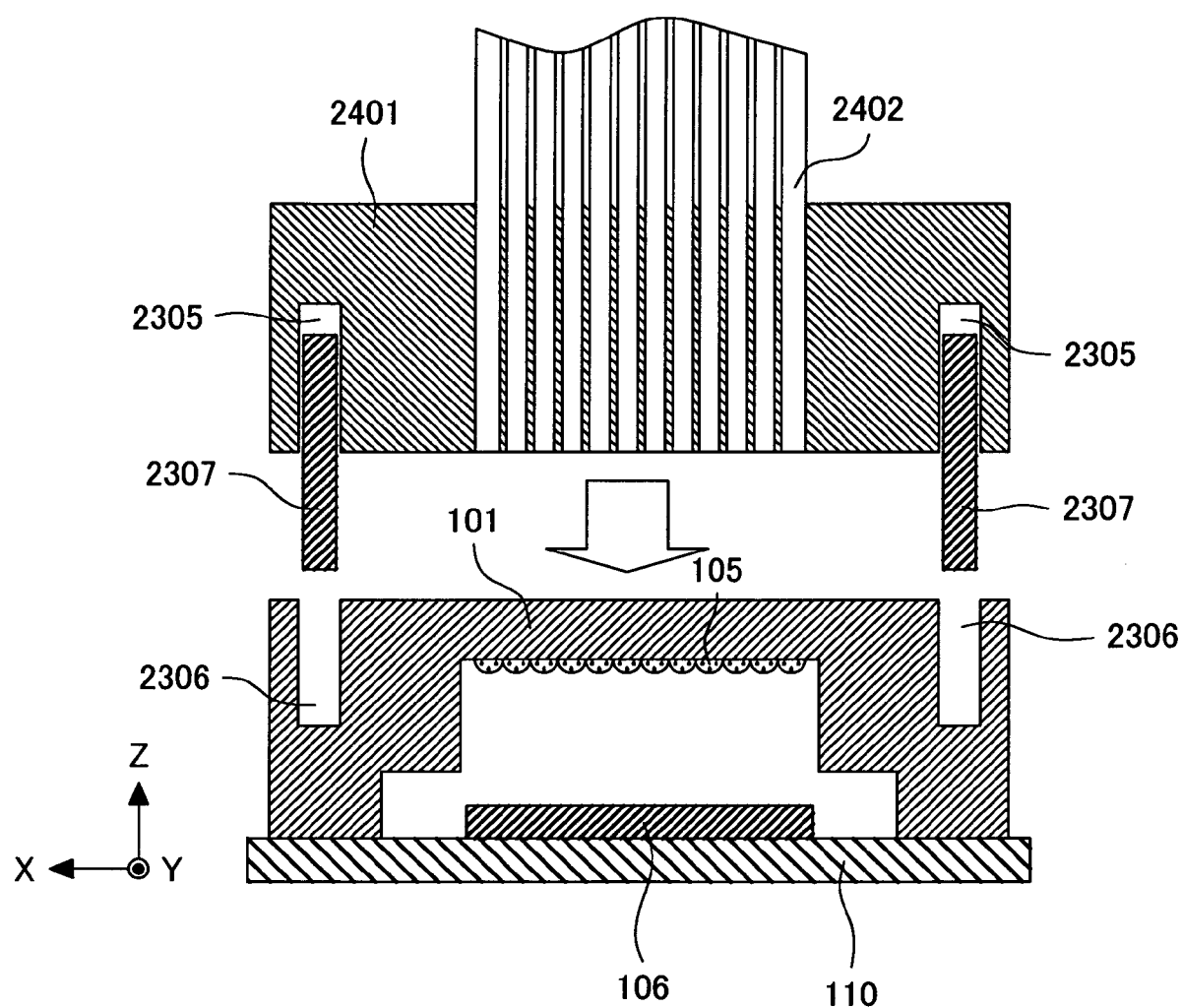
FIG. 17 is a cross-sectional view illustrating another example in which a lens array and a surface emitting laser are aligned and an optical fiber holder is coupled to an integrated optical module.

FIG. 17 is a cross-sectional view illustrating a modification of a configuration in which the lens member 101 and the optical fiber holder 2401 are coupled to each other. Other portions of the configuration are the same as those shown in FIG. 16. In FIG. 17, in place of the fitting convex portion 2301 and the fitting concave portion 2302 for coupling the lens member 101 and the optical fiber holder 2401 to each other, fitting grooves 2305, 2306 having a larger depth are provided in the corresponding portions. Guide pins 2307 are fitted in the fitting grooves 2305, 2306. In this configuration, the lens member 101 and the optical fiber holder 2401 can be coupled to each other more tightly as compared to that in the configuration shown in FIG. 16.

Figure 18:
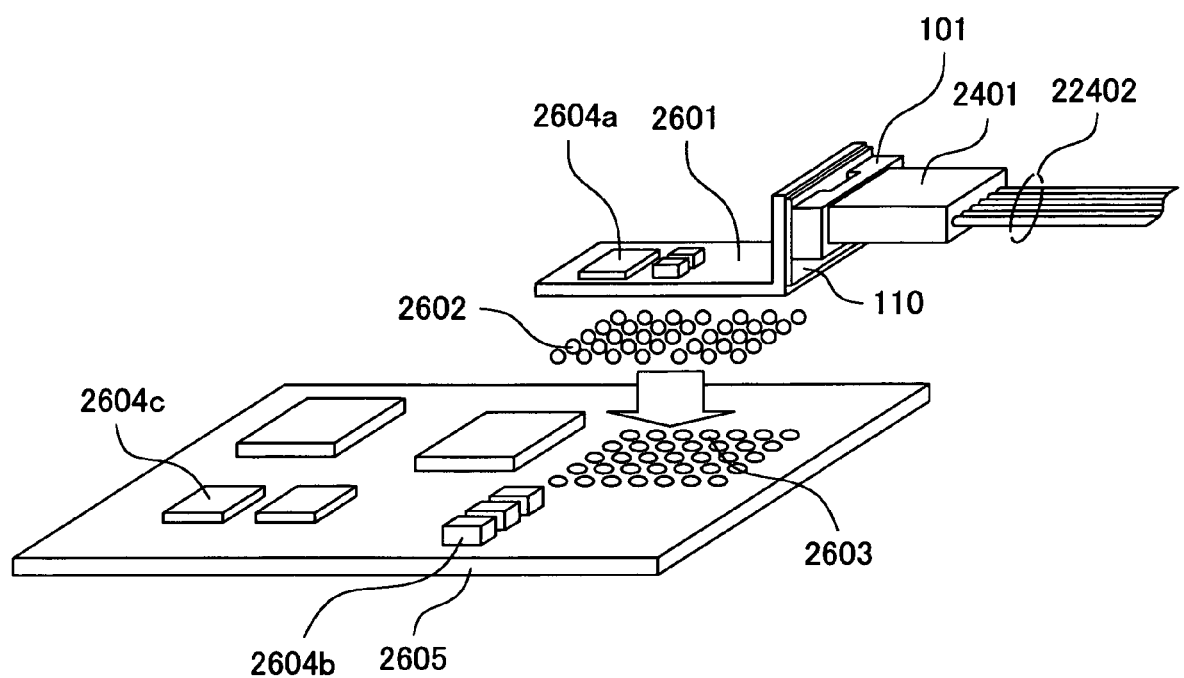

FIG. 18 is a view illustrating an example in which an optical module with an optical fiber coupled thereto is mounted on a board 2605 for a router, a transfer device, and the like. The electric wiring pattern 109 on the board 110 for a photonic device is connected to an electronic circuit device generically denoted by reference numeral 2604a via an electric wiring pattern (not shown) on a printed board 2601. Furthermore, the electric wiring pattern on the printed board 2601 is connected to the electronic circuit device in the state where the printed board 2601 is placed at a prespecified position on and is connected to the board 2605 via an electrode 2603 and a solder 2602 on the board 2605. The board 2605 has an electric wiring pattern (not shown), and connects electronic circuit devices generically denoted by signs 2604b and 2604c to the electrode 2603. Thus the surface emitting laser 106 and the electronic circuit device are connected to each other, and signal transaction with a surface emitting laser at another end of the optical fiber 2402 is performed via the optical fiber 2402.

The optical module according to the optical module is used as an optical module using a surface light emitting/receiving device, and has a function to convert electric signals to optical signals or to convert optical signals to electric signals. The optical modules are accommodated inside devices such as a router, a transfer device, a computer, a display unit, a storage device, a printer or the like and are used for high speed information communications with optical signals through an optical fiber for connection among the devices.

What is claimed is:

1. A method of alignment of an optical module, the optical module including a surface emitting laser mounted on a board for a photonic device with a luminous surface or an acceptance surface thereof formed in a direction reverse to the board and a lens member having a lens to be arranged at a position associated with the surface emitting laser, wherein the surface emitting laser and the lens are provided on the board in a prespecified positional relation, the method comprising the steps of;

forming the lens member with an end face at a surface closer to a position at which the luminous surface or the acceptance surface of the surface emitting laser is provided than to a surface at which the lens included in the lens member is provided;

providing an alignment mark representing the lens position on the end face of the lens member; and by making use of an image obtained by an optical device for visually recognizing a relation between the surface emitting laser and the alignment mark from a top surface of the lens member, performing positional control for the surface emitting laser and the lens such that the prespecified positional relation therefor is provided.

2. The method of alignment of an optical module according to claim 1,
wherein an alignment mark representing the luminous surface or the acceptance surface is provided on the luminous surface or the acceptance surface of the surface emitting laser, and the alignment mark on the luminous surface or the acceptance surface is checked against the alignment mark representing the lens position on the end face to perform positional control for the surface emitting laser and the lens.

3. The method of alignment of an optical module according to claim 2,
wherein a position of the alignment mark formed on a protruding section forming the end face of the lens member and a position of the alignment mark provided on the surface emitting laser are formed at the substantially identical positions on the end face and a surface of the surface emitting laser.

4. The method of alignment of an optical module according to claim 1,
wherein a protruding section forming an end face of the lens member is arranged above at least a portion of the luminous surface or the acceptance surface of the surface emitting laser.

5. The method of alignment of an optical module according to claim 1,
wherein at least one of the alignment marks provided on the end face of the lens member is formed at a position offset from the surface emitting laser, and a light path length from a top surface of the lens member to the alignment mark is substantially identical to a light path length from the top surface of the lens member to the luminous surface or the acceptance surface of the surface emitting laser.

6. The method of alignment of an optical module according to claim 1,
wherein an extruded outward portion or an extruded inward portion is formed on the end face of the lens member and the alignment mark is provided in the convex extruded outward portion or in the extruded inward portion.

7. The method of alignment of an optical module according to claim 1,
wherein the alignment mark provided on the lens member is made from a material with at least one of an optical refractive index, an optical absorbance, and an optical reflectance different from those of the material surrounding the alignment mark.

8. The method of alignment of an optical module according to claim 1,
wherein a relative positional relation between the end face of the lens member and the luminous surface or the acceptance surface of the surface emitting laser is maintained by a supporting section formed at a position further from a projecting portion forming the end face of the lens member than from the lens member.

9. The method of alignment of an optical module according to claim 8,
wherein a relative positional relation between the end face of the lens member and the luminous surface or the acceptance surface of the surface emitting laser is maintained not by the supporting section, but by a pedestal provided between the lens member and the board for a photonic device.

10. The method of alignment of an optical module according to claim 1,
wherein an alignment mark is provided on a surface of the board for a photonic device, and alignment between the lens member and the surface emitting laser or the alignment mark is performed after alignment between the surface emitting laser and the board for a photonic device is performed with the alignment mark.

11. An optical module comprising:
a surface emitting laser mounted on a board for a photonic device with a luminous surface or an acceptance surface thereof formed in a direction reverse to the board; and
a lens member having a lens to be arranged at a position associated with the surface emitting laser; wherein the surface emitting laser and the lens are provided on the board in a prespecified positional relation,
wherein the lens member is formed with an end face at a surface closer to a position at which the luminous surface or the acceptance surface of the surface emitting laser is provided than to a surface at which the lens included in the lens member is provided;
wherein an alignment mark representing the lens position is provided on the end face of the lens member; and
wherein, by making use of an image obtained by an optical device for visually recognizing a relation between the surface emitting laser and the alignment mark from a top surface of the lens member, positional control for the surface emitting laser and the lens is performed such that the prespecified positional relation therefor is provided, thereby performing alignment between the lens member and the surface emitting laser.

12. The optical module according to claim 11,
wherein an alignment mark representing the luminous surface or the acceptance surface is provided on the luminous surface or the acceptance surface of the surface emitting laser, and the alignment mark on the luminous surface or the acceptance surface is checked against the alignment mark representing the lens position on the end face to perform positional control for the surface emitting laser and the lens, thereby performing alignment between the lens member and the surface emitting laser.

13. The optical module according to claim 11,
wherein a protruding portion with an end face of the lens member formed thereon is formed at a position offset from the surface emitting lasers and a light path length from a top surface of the lens member to the end face is made substantially identical to a light path lens from the top surface of the length member to the luminous surface or the acceptance surface of the surface emitting laser, thereby performing alignment between the lens member and the surface emitting laser.

14. The optical module according to claim 11,
wherein an extruded outward portion or an extruded inward portion is formed on the end face of the lens member and the alignment mark is provided in the extruded outward portion or in the extruded inward portion, thereby performing alignment between the lens member and the surface emitting laser.

15. The optical module according to claim 11,
wherein the alignment mark provided on the lens member is made from a material with at least one of an optical refractive index, an optical absorbance, and an optical reflectance different from those of the material surrounding the alignment mark.

16. The optical module according to claim 11,
wherein a relative positional relation between the end face of the lens member and the luminous surface or the acceptance surface of the surface emitting laser is maintained by a supporting section formed at a position further from the projecting portion forming the end face of the lens member than from the lens member, thereby performing alignment between the lens member and the surface emitting laser.

17. The optical module according to claim 16,
wherein a relative positional relation between the end face of the lens member and the luminous surface or the acceptance surface of the surface emitting laser is maintained not by the supporting section, but by a pedestal provided between the lens member and the board for a photonic device.

18. The optical module according to claim 11,
wherein an alignment mark is provided on a surface of the board for a photonic device, and alignment between the lens member and the surface emitting laser or the alignment mark is performed after alignment between the surface emitting laser and the board for a photonic device is performed with the alignment mark, thereby performing alignment between the lens member and the surface emitting laser.

19. The optical module according to claim 11,
wherein a pedestal provided on the board for a photonic device surrounds the surface emitting laser, and the supporting section formed on the end face of the lens member surrounds the lens.

* * * * *